United States Patent [19]
McLellan

[11] Patent Number: 5,986,617
[45] Date of Patent: Nov. 16, 1999

[54] MULTIBAND ANTENNA MATCHING UNIT

[75] Inventor: Scott Wayne McLellan, Albany Township, Pa.

[73] Assignee: Lucent Technologies, Murray Hill, N.J.

[21] Appl. No.: 09/144,610

[22] Filed: Aug. 31, 1998

[51] Int. Cl.⁶ ..................................................... G05F 3/06
[52] U.S. Cl. ........................... 343/860; 323/355; 455/292; 343/861
[58] Field of Search ..................................... 343/860, 850, 343/858, 859, 861, 852; 323/355; 455/292

[56] References Cited

PUBLICATIONS

Hall, Gerald (editor), A Transmatch for Balanced or Unbalanced Lines, The AARL Antenna Book, 1988, pp. 25–8.
Lofgren, Charles; The Z–Match Coupler–Revisited and Revised, The AARL Antenna compendium, vol. 3, 1992; pp. 191–195.

Primary Examiner—Don Wong
Assistant Examiner—James Clinger

[57] ABSTRACT

An unbalanced to balanced antenna matching unit (AMU) is capable of operating over a relatively large frequency range by utilizing multiple transformers connected in series, with a set of bypass switches used to control the number of transformers that are "active" in the matching unit at any particular time. Complex impedance matching by the AMU is controlled by a variable capacitor in parallel with the multiple transformers and a variable capacitor in series with the unbalanced input. The parallel variable capacitor may be located on either side of the transformer arrangement. The transformer output may be configured to switch between matching either a low impedance antenna or a high impedance antenna.

17 Claims, 3 Drawing Sheets

MULTIBAND ANTENNA MATCHING UNIT

BACKGROUND OF THE INVENTION

The present invention relates to a multiband antenna matching unit and, more particularly, to a multiband antenna matching unit comprising multiple transformers, at least one of which can be bypassed to efficiently shift the operating frequency of the matching unit while maintaining the same transformation ratio.

In many environments there is a need to couple an unbalanced transmission line (for example, a 50Ω coaxial cable) to a balanced line, such as a dipole antenna. Conventional arrangements rely on a balun or a fixed transformer with selectable taps to transform an input unbalance load to a balanced output load. In order to operate over a 10:1 (or larger) frequency range (for example, 3–30 Mhz), a conventional fixed inductor and variable capacitor is insufficient (such an arrangement is capable of covering a frequency range of only about 3:1). To achieve the desired 10:1 range, one typically changes the value of the inductor, by methods such as by selecting taps on a coil, varying an expensive roller inductor, or physically (or electrically) changing the inductor.

When using the tap selection arrangement, corona discharge must be avoided by shorting the unused turns, which results in increasing the loss in the inductor. An alternative exemplary prior art solution to this problem is illustrated in FIG. 1, which is defined as a "Z match" antenna matching unit 10. In this arrangement, the inductor includes a pair of output links 12, 14 to switch between a low impedance load (link 12) and a high impedance load (link 14). The variable capacitance on the unbalanced input includes a first capacitance 16 and second capacitance 18, where second capacitance 18 is added (i.e., paralleled) in lower operating frequency ranges. As shown, "Z match" antenna matching unit 10 s capable of providing tuning over a range of approximately 3.5–30 Mhz by electrically "switching" between the tank circuits formed by inductor 15 and capacitors 16 and 18 (see the article entitled "The Z-Match Coupler—Revisited and Revised" by C. A. Lofgren, appearing in *The ARRL Antenna Compendium*, Vol. 3, 1992, page 191 et seq. for a complete discussion, the Lofgren article being herein incorporated by reference). A problem remaining with this arrangement is the presence of circulating currents, as indicated by the arrows, through the non-resonant variable capacitor and inductor combination, thereby significantly reducing the efficiency of the matching arrangement.

Thus, a need remains in the prior art for an antenna matching arrangement that is capable of operating over a relatively large range (10:1, for example) without suffering from the reduction in efficiency present in the prior art.

SUMMARY OF THE INVENTION

The need remaining in the prior art is addressed by the present invention, which relates to a multiband antenna matching unit and, more particularly, to a multiband antenna matching unit that comprises multiple transformers, at least one of which can be bypassed to efficiently shift the operating frequency of the antenna while maintaining the same transformation ratio.

In accordance with an exemplary embodiment of the present invention, a pair of transformers and at least one associated variable capacitor is used to form the matching unit. The transformers are connected in series, with a switch included to bypass one of the transformers in order to obtain the higher operating frequency range. Since none of the transformer turns are shorted (that is, the entire transformer is either switched "in" or "out"), the arrangement of the present invention exhibits relatively high efficiency when compared with prior art arrangements. An additional bypass switch may be used across the secondary winding of the bypassed transformer to further reduce any induced current flow and improve the operating efficiency of the matching unit.

In a preferred embodiment of the present invention using a pair of transformers, one of the transformers is chosen to have eight times the inductance of the other transformer, while each exhibits an essentially identical primary/secondary turns ratio. Such an arrangement allows for a relatively large frequency range (for example, 3–30 Mhz).

A "high/low" impedance switch may be included at the output of the matching unit to allow selection of secondary winding taps or separate secondary windings. This selection ability provides for an improved impedance matching range for various load impedances.

Other and further arrangements of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
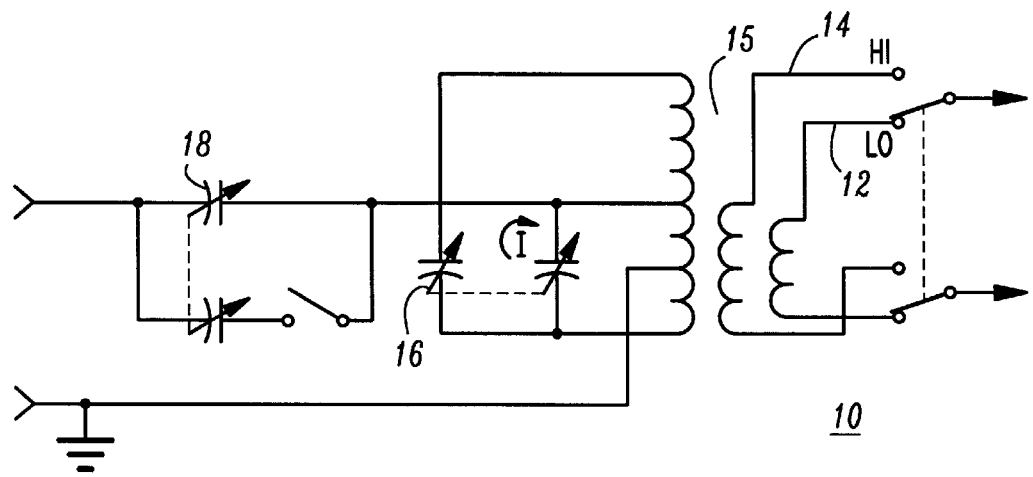
FIG. 1 illustrates a prior art "Z match" antenna matching unit.
Figure 2:
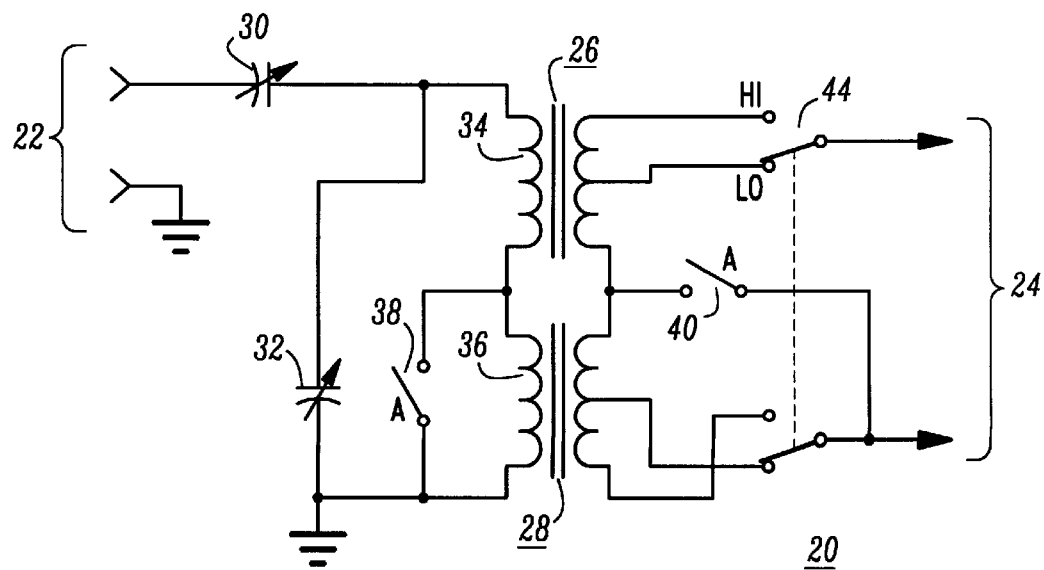
FIG. 2 is an exemplary two-transformer antenna matching unit formed in accordance with the present invention.

An exemplary antenna matching unit (AMU) 20 formed in accordance with the present invention is illustrated in FIG. 2. It will be presumed for the purposes of the present discussion that AMU 20 is used to provide matching between an unbalanced input 22, such as a 50Ω transmission line and a balanced load 24, such as a dipole antenna. Other unbalanced/balanced (or, alternatively, unbalanced/unbalanced) load combinations are possible and all are considered to fall within the scope of the present invention. Referring to FIG. 2, AMU 20 comprises a pair of transformers 26,28, with a pair of variable capacitors 30,32 disposed between unbalanced load 22 and the primary windings 34,36 of transformers 26 and 28. In particular, second variable capacitor 32 is disposed in parallel with primary windings 34,36. The combination of capacitors 30,32 and the inductance of transformers 26,28 is used to perform complex impedance matching between unbalanced input 22 and load 24. As will be explained in detail below, additional range in impedance matching is possible through various transformer primary to second winding ratios.

In accordance with the present invention, a bypass switch 38 is disposed across primary winding 36 of second transformer 28. When switch 38 is in its "open" position, both transformers 26 and 28 are in series and, with variable capacitors 30,32, defining the operating characteristics of AMU 20. Since the operating frequency is inversely proportional to the inductance, the larger inductance limits the operating frequency. Therefore, in order to obtain the higher range of operating frequencies, second transformer 28 is bypassed by closing bypass switch 38. A second bypass switch 40 may be included around secondary winding 42 of second transformer 28 to insure that the effects of this winding (e.g., losses, leakage inductance, etc.) are eliminated. The particular inductances associated with each transformer may be controlled to provide the desired frequency range of operation. For example, the total inductance may be defined as $L_{TOT}$, where $L_{TOT}=L_{26}+L_{28}$. In a preferred arrangement, $L_{26}=(1/8)L_{28}$. Therefore, $L_{26}=(1/9)L_{TOT}$ and $L_{28}=(8/9)L_{TOT}$. The action of closing bypass switch 38 will therefore shift the operating frequency from a range of, for example 3–10 Mhz to a range of, for example, 10–30 MHz. Various other ranges are possible. Exemplary component values are: $L_{26}$, 1 $\mu$H; $L_{28}$, 8 $\mu$H; and the maximum capacitance for variable capacitors 30, 32, 240 pF.

Referring again to FIG. 2, a "high/low" impedance switch 44 is shown and may be included between the output of transformers 26,28 and balanced load 24. In particular, switch 44 includes a first setting across the taps of secondary windings 46,48 of transformers 26,28 and a second setting across the outer terminals of secondary windings 46, 48. When coupling to a low impedance balanced output, the tap connection is used. Alternatively, when coupling to a high impedance balanced output, the outer terminal connections of transformers 26, 28 are used. It is to be understood that the use of such an impedance output switch is considered optional in the practice of the present invention.

To reduce losses in AMU 20, transformers 26,28 should be magnetically isolated from each other. By using torroidal transformers cores for transformers 26,28, the isolation is inherent, but core losses may be significant. Air core transformers may be used for reduced losses, but need to be oriented orthogonal to one another (or shielded) to reduce magnetic coupling.

Figure 3:
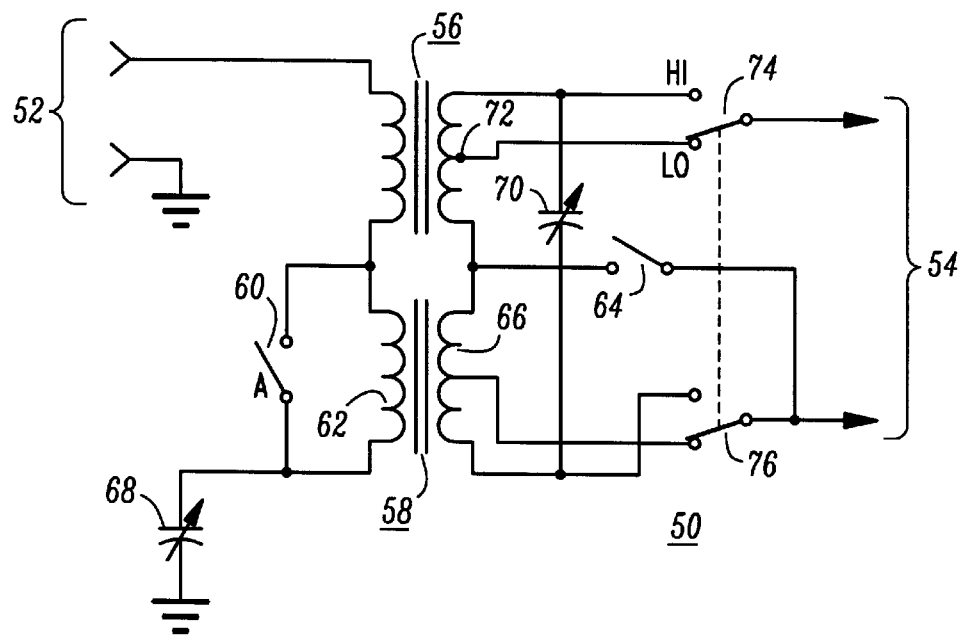
FIG. 3 is an alternative embodiment of the arrangement of FIG. 2, with the variable parallel capacitance included on the output side of the antenna matching unit.

As mentioned above, the required parallel capacitance may be located on either side of the AMU. FIG. 3 illustrates an AMU 50 including the parallel capacitance on the balanced load side of the matching unit. As with the arrangement described above, AMU 50 is used to provide matching between an unbalanced load 52 (e.g., a coaxial transmission line connected to a transceiver) and a balanced load 54 (e.g., a balanced transmission line connected to a dipole antenna) and includes a pair of transformers 56 and 58. A bypass switch 60 is disposed around primary winding 62 of second transformer 58 and is used to bypass second transformer 58 for operating AMU 50 at high frequencies. A second bypass switch 64 may be similarly disposed to bypass secondary winding 66 of second transformer 58. In the arrangement of FIG. 3, the variable capacitance is provided by a first capacitor 68 disposed between bypass switch 60 and ground, and a second capacitor 70, on the balanced load side of AMU 50, disposed in parallel with secondary windings 72 and 66 of first and second transformers 56 and 58, respectively. When operating in the lower part of the frequency range (for example, 3–10 Mhz), bypass switches 60 and 64 are maintained in their open position so that both transformers 56 and 58 are included in the network matching unit. For coupling unbalanced load 52 to balanced load 54 at higher frequencies (for example, 10–30 MHz), bypass switches 60 and 64 are closed so that only first transformer 56 is included in the matching unit. A pair of switches 74, 76 provide for matching to "high" and "low" output impedance values. In a first, low impedance position, switches 74 and 76 are tap coupled to secondary windings 72 and 66. In the second, high impedance position, switches 74 and 76 are coupled to the outer terminals of secondary windings 72 and 66.

Figure 4:
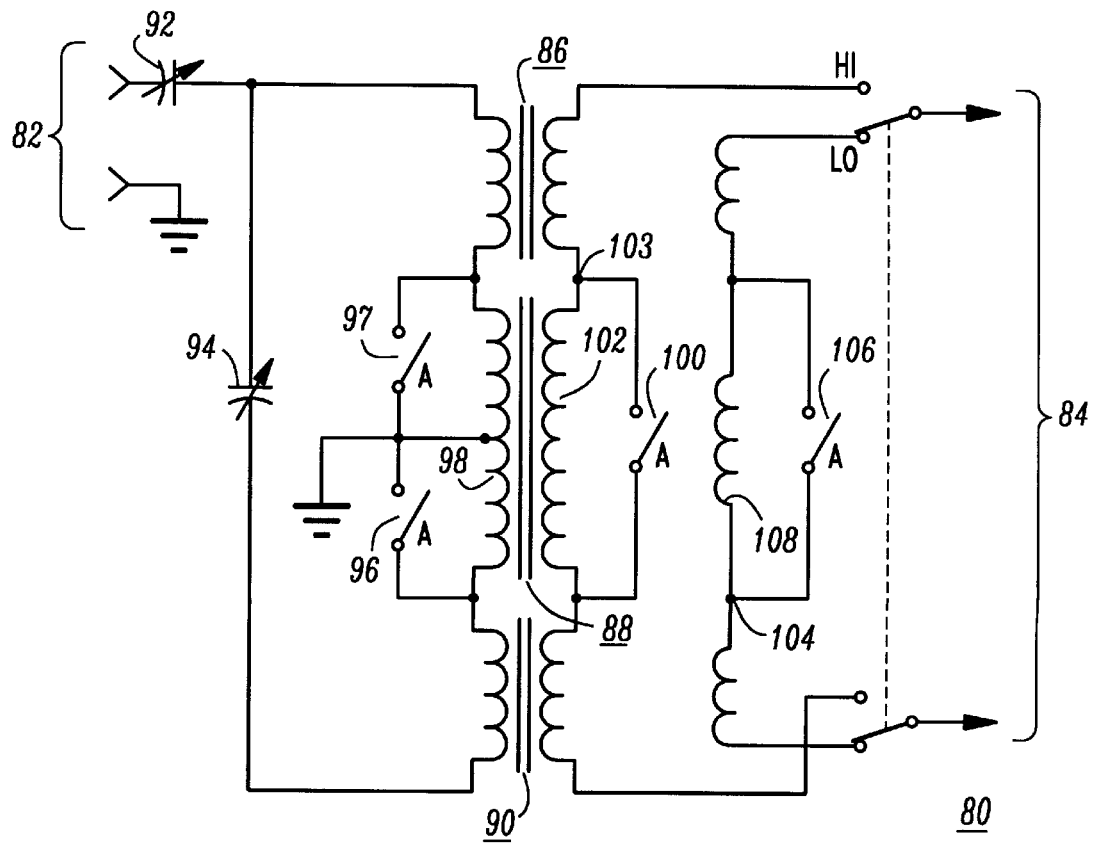
FIG. 4 illustrates an embodiment of the present invention utilizing a set of three transformers to cover the desired frequency range, with the centrally disposed transformed bypassed using a symmetrically disposed pair of bypass switches.

The multiple transformer AMU of the present invention may use more than a pair of transformers to provide the desired antenna matching over the frequency range of interest. FIG. 4 illustrates an exemplary AMU 80 utilizing a set of three transformers 86, 88 and 90 to provide matching between an unbalanced input load 82 and balanced output load 84. A pair of variable capacitors 92 and 94 are disposed on the unbalanced side of AMU 80, where second capacitor 94 is disposed in parallel with the series-connected primary windings of transformers 86, 88 and 90. For the particular embodiment of FIG. 4, switching between operating frequency ranges is provided by a pair of bypass switches 96 and 97 coupled in a balanced relationship around primary winding 98 of second transformer 88. In particular, first bypass switch 96 is coupled in parallel with a first portion of primy winding 98 and second bypass switch 97 is coupled in parallel with the remaining portion of primary winding 98, with both bypass switched also coupled to ground. By using a symmetrical bypass arrangement, AMU 80 is itself more fully "balanced" than either configuration of FIGS. 2 and 3, thus providing essentially identical output currents to balanced load 84. Further in accordance with the present invention, an additional bypass switch 100 may be coupled, as shown, around a central portion of secondary winding 103 of transformer 88.

For the embodiment of FIG. 4, the capability to match either a high impedance load and low impedance load is enhanced by including a second set of secondary windings 104, disposed as shown. The number of turns of secondary winding 104 is less than the number of turns of secondary winding 103. A bypass switch 106 is disposed to surround a central portion 108 of windings 104. When operating with a low impedance load 84, the balanced output is taken from windings 104, since the fewer number of turns on secondary winding 104 allows for a better match with a lower impedance load. For higher impedance loads 84, the balanced output is taken from the secondary winding 103 of transformers 86, 88 and 90.

Figure 5:
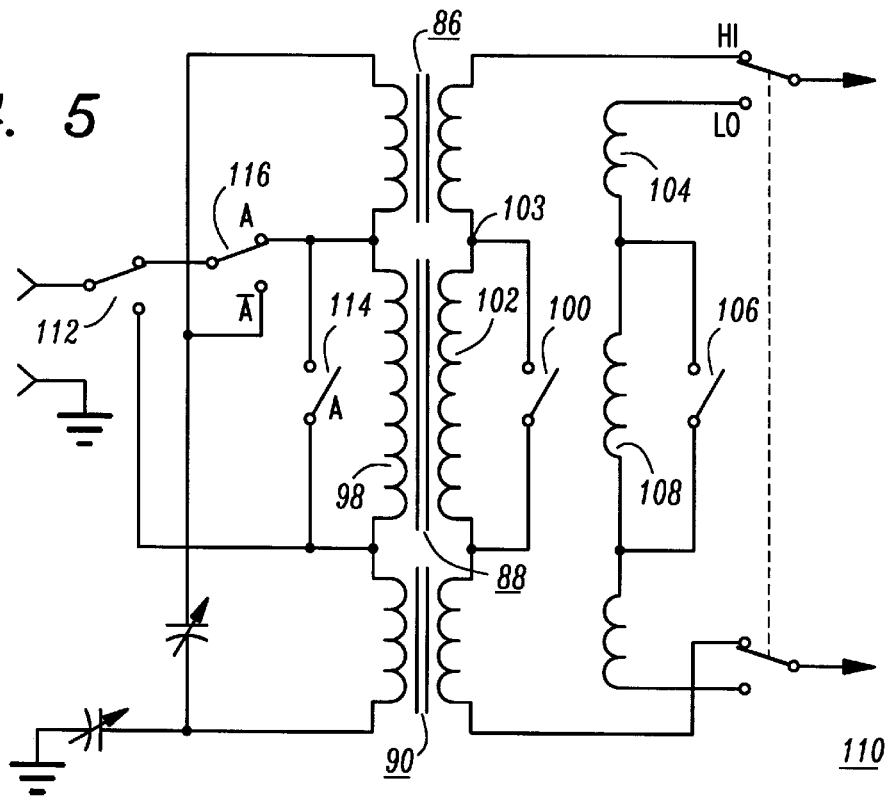
FIG. 5 is yet another embodiment of the present invention, also utilizing a set of three transformers, and including a second switch for controlling the transformation ratio associated with the matching arrangement.

With an AMU arrangement including a set of three transformers, it is also possible to control the transformation ratio on the transformer primary side to further define the impedance transformation range. FIG. 5 illustrates an exemplary AMU 110 that is similar to AMU 80 of FIG. 4, but further includes a transformation control switch 112 that is used to modify the transformation ratio of AMU 110, in either the "full inductance" mode (i.e., with an open bypass switch 114) or "bypass" mode (i.e., with bypass switch 114 in the closed position). Referring to FIG. 5, bypass switch 114 is connected across the primary winding of second transformer 88 (in contrast to AMU 90 which utilized a pair of symmetrically disposed switches 96,97). A second bypass switch 116, operated in conjunction with bypass switch 114, is required in this embodiment, where switch 116 is a "normally closed" switch disposed between transformation control switch 112 and the intermediate terminal between first transformer 86 and second transformer 88. It is to be noted that additional various transformation ratios can be obtained by setting the turns ratio between each set of primary and secondary windings to any predetermined value. Any suitable transformation ratio may be used in practicing the multiple transformer "bypass" arrangement of the present invention.

Figure 6:
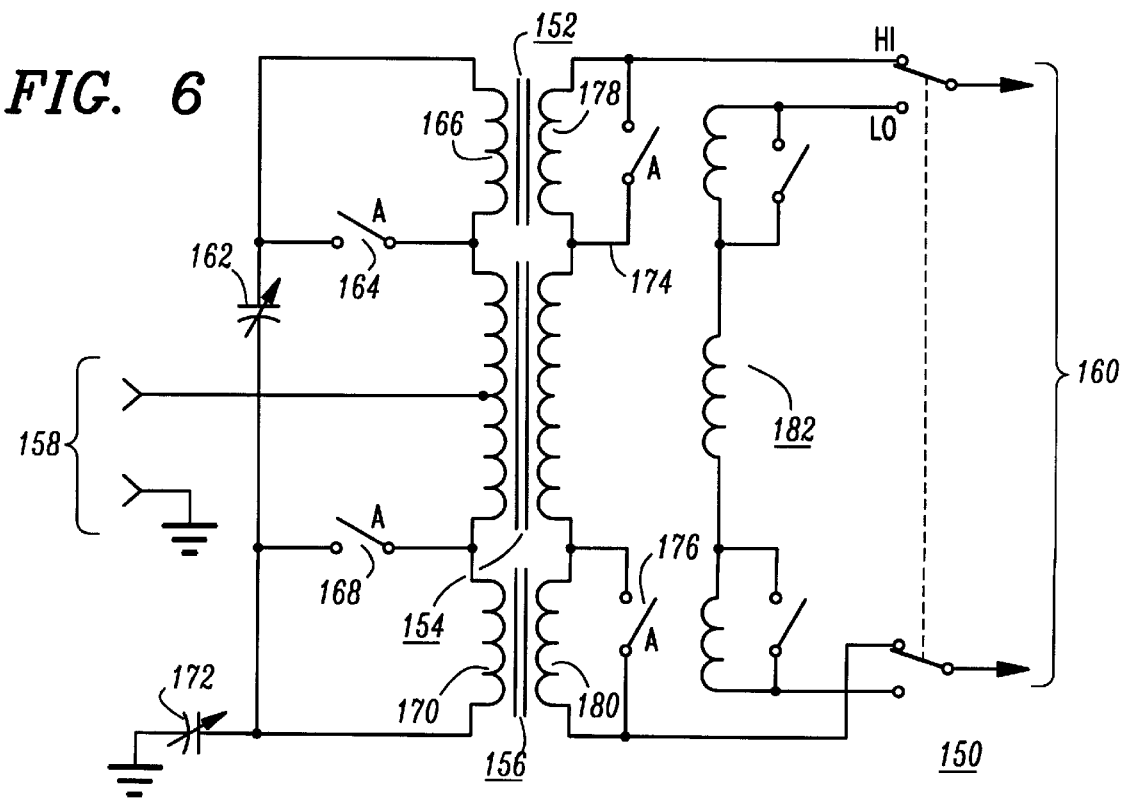
FIG. 6 is an alternative embodiment of the present invention using a center-tapped primary winding on the input side of the matching unit.

An alternative AMU arrangement 150 is illustrated in FIG. 6. As with the arrangements described above, a set of three transformers 152, 154 and 156 are used to provide matching between an unbalanced input 158 and a balanced output 160. In AMU 150, a variable capacitor 162 is coupled in parallel with transformers 152, 154 and 156. A first bypass switch 164 is coupled to primary winding 166 of first transformer 152 and a second bypass switch 168 is coupled to primary winding 170 of third transformer 156. A second variable capacitor 172 is coupled between bypass switches 164,168 and ground. In this embodiment therefore, when bypass switches 164 and 168 close (for higher frequency operation), only second transformer 154 remains in the network of AMU 150. The utilization of a center-tapped second transformer 154 results in a more symmetric arrangement and, therefore, improved balance. On the balanced load side, bypass switches 174,176 may be used to couple around secondary windings 178,180 of first and third transformers 152 and 156, respectively. As with the arrangement of FIG. 4, a second set of windings 182 may be included on the balanced load side and used to provide a means for switching between a low output impedance arrangement and a high output impedance arrangement.

Other and further antenna matching units including one or more bypassed transformers are possible. For example, additional transformers and bypass switches may be added in a cascaded relationship. Variable capacitances may be inserted in parallel on either side of the transformer structure. Additional secondary windings may be added for additional transformation ratios. Further, an autotransformer arrangement may be used in place of the transformers discussed above, where appropriate. All or some of these modifications may be accomplished in combination. Still further, the switches shown may be manually operated switches, relay contacts, semiconductor switch points, etc. that can handle the maximum RF current and voltages which may present in the AMU. All of these variations are considered to fall within the spirit and scope of the present invention as defined by the claims appended hereto.

What is claimed is:

1. A matching unit for providing impedance matching between an unbalanced input load and an output load over a frequency range, said matching unit comprising a plurality of series-connected transformers, each transformer defined by a primary winding and an associated secondary winding, the unbalanced input load coupled to the series-connected primary winding side of said plurality of series-connected transformers and the output load coupled to the series-connected secondary winding side of said plurality of series-connected transformers;

a variable capacitance connected in parallel with said plurality of series-connected transformers;

at least one bypass switch coupled across a primary winding of at least one transformer of said plurality of series-connected transformers, the position of said at least one bypass switch used to control the inductance present in said matching unit, said at least one bypass switch being in the open position for a lower frequency range of said matching unit and in the closed position for a higher frequency range of said matching unit.

2. A matching unit as defined in claim 1 wherein the unit further comprises at least one output bypass switch coupled around a secondary winding of the at least one transformer.

3. A matching unit as defined in claim 1 wherein the unit further comprises output impedance matching comprising a switching arrangement including a first position coupled between the outermost terminals of the secondary windings of the plurality of series-connected transformers and a second position coupled between tap terminals of the secondary windings of the plurality of series-connected transformers, the switching arrangement being in the second position for low impedance matching and in the first position for high impedance matching.

4. A matching unit as defined in claim 1 wherein the unit further comprises output impedance matching comprising a second set of secondary windings disposed on said plurality of series-connected transformers and having fewer turns than said secondary windings;

a switch coupling the load between the secondary windings and said second set of secondary windings.

5. A matching unit as defined in claim 1 wherein the variable capacitance is connected transformers in parallel with the primary windings of the plurality of series-connected transformers.

6. A matching unit as defined in claim 1 wherein the variable capacitance is connected transformers in parallel with the secondary windings of the plurality of series-connected transformers.

7. A matching unit as defined in claim 1 wherein the plurality of series-connected transformers comprises a plurality of series-connected transformers having a total inductance $L_{TOT}$ and a bypass switch is coupled across the primary winding of the second transformer.

8. A matching unit as defined in claim 7 wherein a first transformer of the pair of series-connected transformers exhibits an approximate inductance of $\frac{1}{8}L_{TOT}$ and a second, remaining transformer of said plurality of series-connected transformers exhibits an approximate inductance of $\frac{7}{8}L_{TOT}$.

9. A matching unit as defined in claim 1 wherein the plurality of series-connected transformers comprises a set of three transformers disposed in a series relationship to define a first end transformer, an intermediate transformer and a second end transformer, a bypass switching arrangement being coupled across the primary winding of the intermediate transformer.

10. A matching unit as defined in claim 9 wherein the bypass switching arrangement comprises a pair of bypass switches, a first switch coupled between a first end of the intermediate transformer and a grounded center-tap of said intermediate transformer, and a second switch coupled between a second, remaining end of said intermediate transformer and said grounded center-tap.

11. A matching unit as defined in claim 9 wherein the matching unit further comprises a transformation control switch coupled between the unbalanced input load and the terminals of the intermediate transformer for controlling the transformation ratio associated with the set of three transformers, the switching having a first position combining the inductance values of the intermediate transformer and the second end transformer and a second position combining the inductance values of the first and second end transformers.

12. A matching unit as defined in claim 1 wherein the output load is balanced.

13. A matching unit as defined in claim 1 wherein the plurality of series-connected transformers comprises a set of three transformers disposed in a series relationship to define a first end transformer, an intermediate transformer and a second end transformer, a bypass switching arrangement being coupled across the primary windings of the first and second end transformers.

14. A matching unit as defined in claim 13 wherein the bypass switching arrangement comprises a pair of bypass switches, a first switch coupled across the primary winding of the first end transformer, and a second switch coupled across the primary winding of the second end transformer.

15. An antenna matching unit for providing impedance matching between an unbalanced transmission line and an antenna over a frequency range, said antenna matching unit comprising a first transformer defined by primary and secondary windings;

a second transformer, defined by primary and second windings, said second transformer primary and secondary windings connected in series with respective windings of said first transformer;

a first variable capacitance coupled in parallel with the primary windings of said first and second transformers;

a second variable capacitance connected in series between the unbalanced transmission line and the interconnection of said first variable capacitance and said first transformer, and a bypass switch connected across the primary winding of said second transformer, said bypass switch being in the "open" position for low frequency operation of said antenna matching unit and being in the "closed" position for high frequency operation of said antenna matching unit.

16. An antenna matching unit as defined in claim 15 wherein the matching unit further comprises a second bypass switch, connected across the secondary winding of said second transformer, said second bypass switch being in the "open" position for low frequency operation of said antenna matching unit and being in the "closed" position for high frequency operation of said antenna matching unit.

17. An antenna matching unit as defined in claim 15 wherein the output antenna load is balanced.

* * * * *